Figure 1:
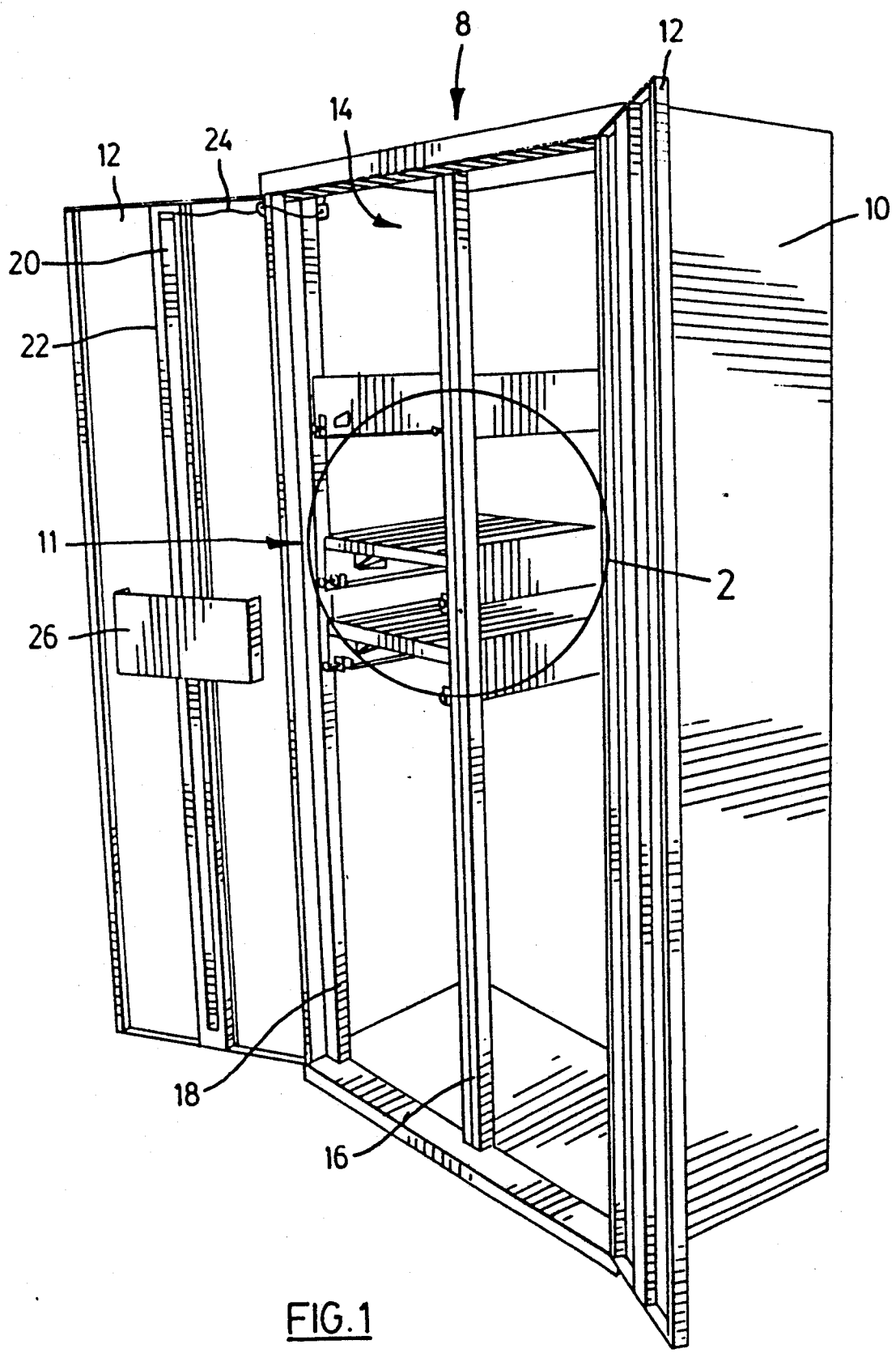

United States Patent [19]

Moulton et al.

[11] Patent Number: 5,168,431
[45] Date of Patent: Dec. 1, 1992

[54] HEIGHT ADJUSTING MECHANISM FOR SHELF IN STORAGE CABINET FOR ELECTRONIC CIRCUITS BOARDS

[75] Inventors: John L. Moulton; Frank G. Camilleri, both of Brampton, Canada

[73] Assignee: Dasco Data Products Limited, Brampton, Canada

[21] Appl. No.: 686,602

[22] Filed: Apr. 17, 1991

[30] Foreign Application Priority Data

Jun. 22, 1990 [CA] Canada .................................. 2019620

[51] Int. Cl.⁵ .............................................. H05K 7/14
[52] U.S. Cl. ...................................... 361/415; 211/41; 361/412
[58] Field of Search ............... 361/415, 390, 391, 424, 361/427, 429; 174/35 R, 35 MS, 35 TS; 312/257.1; 211/41; 439/61, 62

[56] References Cited

U.S. PATENT DOCUMENTS

| | | | |
|---|---|---|---|
| 3,231,785 | 1/1966 | Calabro | 361/415 |
| 3,899,721 | 8/1975 | Borchard et al. | 361/415 |
| 4,327,835 | 5/1982 | Leger | 361/399 X |
| 4,797,784 | 1/1989 | Belanger, Jr. | 361/395 |
| 5,008,779 | 4/1991 | Salmon | 361/415 |

FOREIGN PATENT DOCUMENTS

| | | | |
|---|---|---|---|
| 1231750 | 1/1988 | Canada | 361/415 |
| 1231773 | 1/1988 | Canada | 361/415 |

Primary Examiner—Leo P. Picard
Assistant Examiner—D. Sparks
Attorney, Agent, or Firm—Smart & Biggar

[57] ABSTRACT

The present invention provides for a shelf and bracket assembly which may be used in various applications including in a cabinet for the storage of circuit boards. The shelf and bracket assembly comprises vertical brackets with slots, horizontal brackets with tabs, slidable brackets with inclining surfaces, a shelf with declining surfaces, and adjustment feature, whereby a first general height adjustment of the shelf may be followed by a fine-tuning height adjustment. The invention also provides for a circuit board guide strip which is reusable and which may be inserted into holes in the shelf surface in a lockable relationship.

14 Claims, 6 Drawing Sheets

HEIGHT ADJUSTING MECHANISM FOR SHELF IN STORAGE CABINET FOR ELECTRONIC CIRCUITS BOARDS

The invention herein relates to a shelf and a fine height adjustment mechanism therefor which may be used for the purpose of storing electronic circuit boards in an anti-static storage cabinet. The invention also relates to a guide strip for use on a shelf to support an electronic circuit board in an up-right position.

Many organizations such as telephone utilities use a large number of plug-in type of electronic circuit boards. Depending on the volume of use of such circuit boards, such organizations must temporarily store surplus circuit boards during periods of non-use.

Electronic plug-in type circuit boards are relatively expensive to repair or replace. Accordingly, such circuit boards must be stored in an environment protected from physical damage as well as damage resulting from static electricity. Although it is easy to store electronic circuit boards in a secure storage cabinet so as to avoid physical damage, it is relatively difficult to maintain such a storage cabinet free from static electricity, whether ambient, or originating from either the storage cabinet, the circuit board itself or an individual handling either of the aforesaid. The integrated circuits on an electronic circuit board are highly susceptible to be damaged by such static electricity. The greatest threat of damage is posed by static electricity found in the ambient air or discharged from an individual handling such circuit boards while they are being deposited or retrieved from storage.

Accompanying the greatly expanding use of electronic circuit boards is a surge in the demand for a facility for their safe storage.

It is known in the prior art to store such circuit boards in an up-right position in an anti-static storage facility in which static electricity is dissipated or conducted away from the circuit boards to the ground. Reference is made to Canada Patents Nos. 1,231,750 and 1,231,773 both issued Jan. 19, 1988. Although such prior art facilities or cabinets provide a storage environment relatively safe from physical abuse and ambient static electricity, such prior art storage cabinets employ a crude mechanism for adjusting the height of shelves which is cumbersome, time consuming and depending on the user, sometimes inaccurate. Electronic circuit boards exist in a variety of height, width and depth dimensions. They are generally stored in an up-right position. If such circuit boards are not securely held between shelves in an up-right position there is a risk of the shelves falling laterally with consequent damage the board and possibly other circuit boards stored nearby. Furthermore, circuit boards which do not fit snugly between shelves in a storage cabinet are less likely to have any static electricity in the boards dissipated to ground as effectively as otherwise possible. The shelf height adjusting mechanism disclosed in the aforesaid patents requires manual adjustment of each corner of a shelf relative to a corresponding bracket with the subsequent repeated use of a level in order to independently adjust the height of each of the four corners of a rectangular shelf to make it level with the horizon. Such a height adjusting mechanism is crude and inefficient and obviously requires a great deal of labour intensive adjusting and measuring every time the height of a shelf needs to be adjusted in order to accommodate a taller circuit board (in up-right position).

As also may be noted from the aforesaid patents, it is known to provide shelves for use in anti-static storage cabinets which have guide strips on their upper and lower surfaces for the purpose of accommodating electronic circuit boards when stored in an up-right position. Such guide strips have in the past been made either an integral part of the shelf surface (moulded plastic) or have been individually glued to the surface of a shelf in pre-determined positions to accommodate the dimensions of the circuit board to be stored. In the up-right position, electronic circuit boards come in an almost infinite number of widths, in view of the number of different components of varying sizes which may extend laterally relative to the surface of the circuit board. Typically, guide strips, whether integral with the shelf or glued or in some other manner attached to the shelf, are spaced in close proximity to one another in which case the slots or tracks of each adjacent guide strip may not be usable in the presence of a particularly wide circuit board. For example, if the slot of each guide strip is 50 mm wide and each guide strip has a side wall of 50 mm in width, then abutting guide strips will have adjacent slots a minimum of 100 mm apart. Under such circumstance, storing up-right an electronic circuit board having a width in excess of 200 mm will result in adjacent guide strips not being usable providing a disadvantage due to wastage of space on the shelf as well as the wasted cost of guide strips present on the shelf which cannot be used.

The present invention has overcome the aforesaid disadvantages in prior art shelf height adjustment mechanisms and prior art guide strips for use on shelf surfaces.

The present invention provides a height adjusting mechanism for a shelf in a storage cabinet for electronic circuit boards which may be easily, accurately and quickly adjusted to permit storage of any size circuit board, without requiring the use of a level for each adjustment.

The present invention further provides for a guide strip —shelf assembly wherein guide strips may be easily and quickly relocated on the surface of the shelf whenever necessary.

Lastly, the present invention provides for a shelf and bracket assembly which may be used in applications other than in relation to the storage of circuit boards, wherein a first general height adjustment is followed by the need for a "fine-tuning" height adjustment.

In particular, the present invention provides an anti-static cabinet for storing electronic circuit boards comprising, a housing provided with means to access the interior space therein, at least four elongated vertical brackets each fixed relative to said housing, at least two shelves each having front, side, rear, top and bottom faces and means suitable for supporting therebetween electronic circuit boards in an up-right position, at least two horizontal stationary brackets each one extending horizontally between two elongated vertical brackets and each with means for attaching to the elongated vertical brackets at various locations along the vertical length thereof, a slidable element communicating with each horizontal stationary bracket said slidable element having at least one inclining surface of a first angle, at least one of said at least two shelves having at least one declining surface projecting downward from said shelf adjacent each side thereof, said declining surface having a second angle corresponding to the first angle of the inclining surface of the slidable element such that said declining surface may come into flush contact with said inclining surface, each of said horizontal stationary brackets having means for supporting an opposite side of said at least one shelf in a manner permitting only vertical movement of each side of the shelf relative to said horizontal stationary bracket, and adjustment means for horizontally moving each of said slidable elements so that pressure may be increased or decreased on said declining surface of said horizontal stationary bracket depending on the forward or backward direction of said horizontal movement, resulting in the respective side of said shelf moving vertically upwards or downwards relative to the said horizontal stationary bracket, whereby the perpendicular distance between said shelves may be adjusted.

The present invention also provides for a guide strip for communicating with a surface of a shelf for use to support an electronic circuit board in an up-right position, said guide strip having an underside and a top side with at least two legs on the underside thereof one of said two legs having a foot, said guide strip having an elongated slot on the top side thereof for receiving an edge of a circuit board, said surface having a front face and the surface of said shelf having a first hole of a shape suitable to trap the foot of said leg when inserted therein and horizontally shifted, the surface of said shelf having a second hole into which the other of said at least two legs can be press fitted, said first and second holes being located on the shelf surface in an alignment perpendicular to the front face of the shelf, whereby said guide strip may be securely attached to the surface of the shelf by first trapping in the first hole the foot of one leg and thereafter by press fitting the other leg into the second hole, and whereby said guide strip may be removed from the surface of the shelf by first releasing the leg from the second hole and thereafter by moving the guide strip to release the foot of the remaining leg.

The present invention further provides for an adjustable bracket and shelf assembly comprising at least four elongated vertical brackets each capable of being fixed relative to each other to form the corners of a rectangle, at least one shelf having front, side, rear, top and bottom faces, at least two horizontal stationary brackets each one extending between two elongated vertical brackets and each with means for simultaneously attaching to two elongated vertical brackets at various locations along the lengths thereof, a slidable element communicating with each horizontal stationary bracket said slidable element having at least one inclining surface of a first angle, said shelf having at least one declining surface projecting downward therefrom adjacent to each side thereof, said declining surface having a second angle corresponding to the first angle of the inclining surface of the slidable element such that said declining surface may come into flush contact with said inclining surface, each of said horizontal stationary brackets having means for supporting an opposite side of said shelf in a manner permitting only vertical movement of each side of the shelf relative to said horizontal stationary bracket, an adjustment means for horizontally moving each of said slidable elements so that pressure may be increased or decreased on said declining surface of said horizontal stationary bracket depending on the forward or backward direction of said horizontal movement, resulting in the respective side of said shelf moving vertically upwards or downwards relative to the said horizontal stationary bracket.

Figure 2:
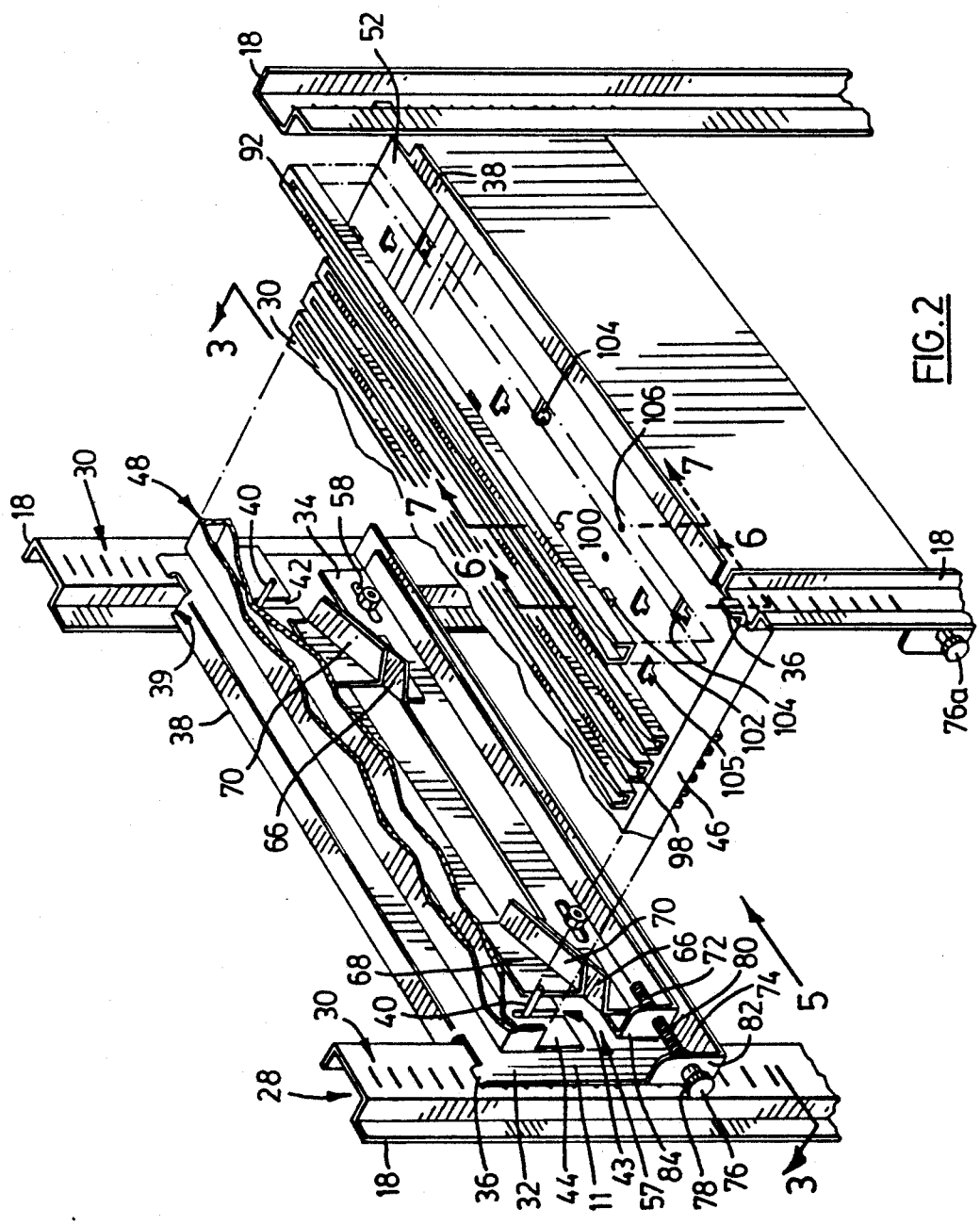
Figure 3:
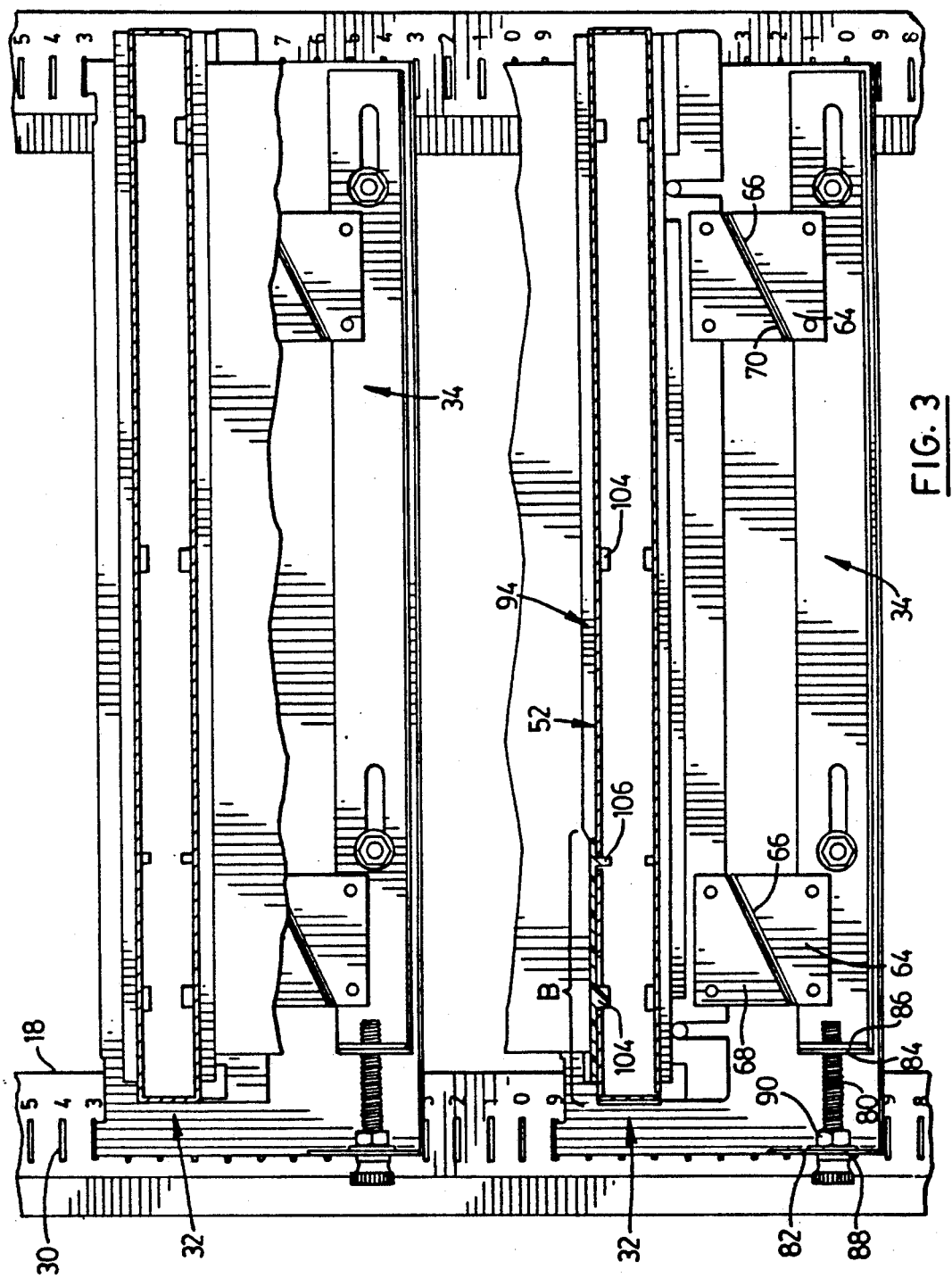
Figure 4:
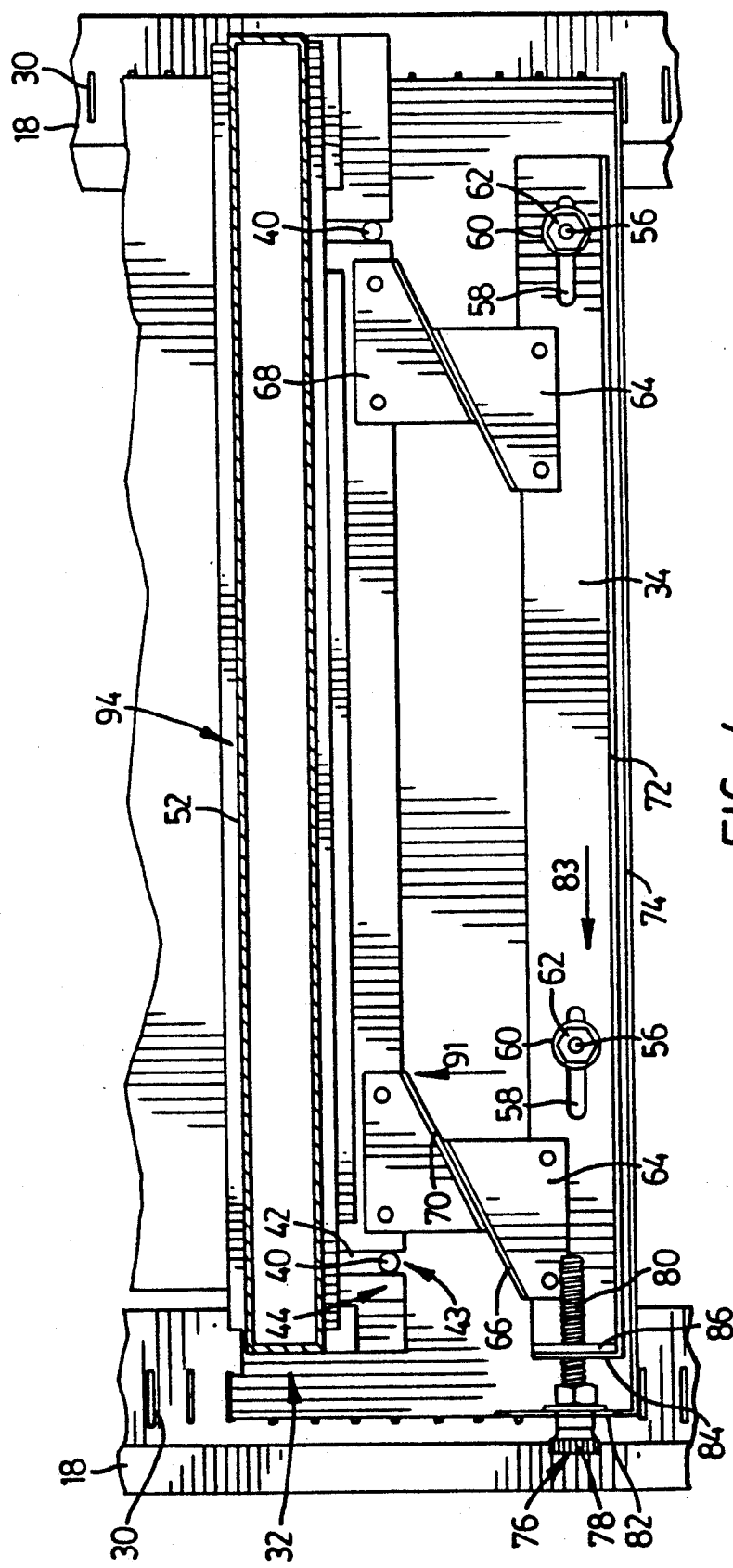
Figure 5:
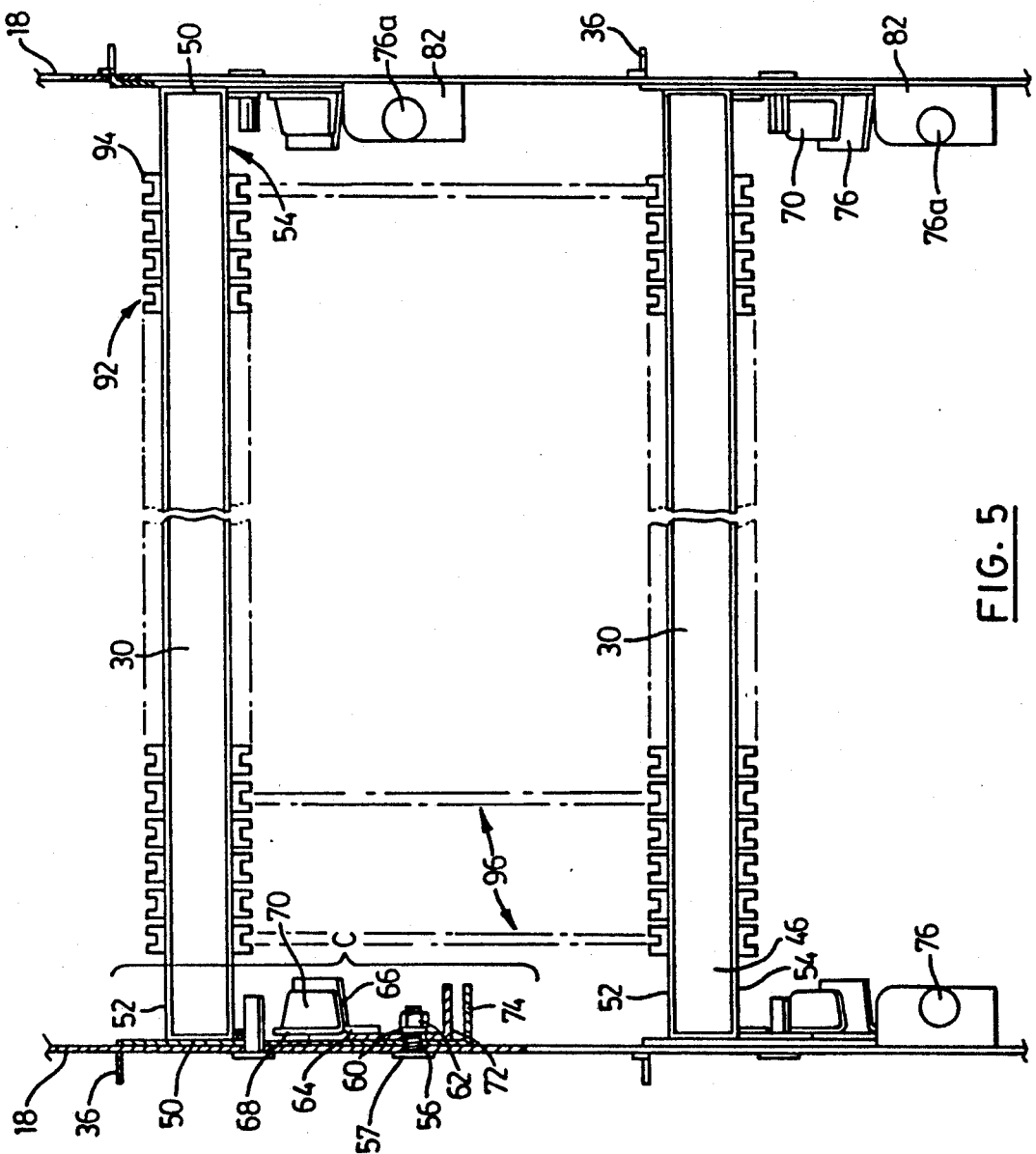
Figure 7:
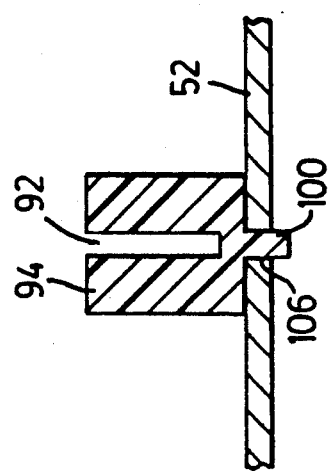
Figure 6:
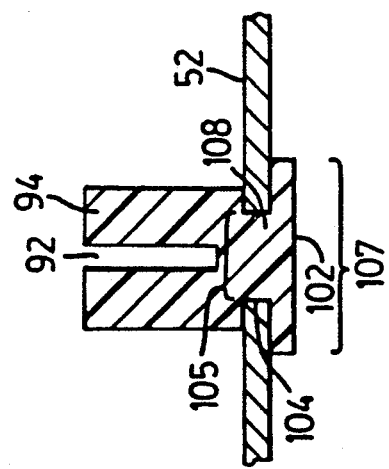

In drawings which illustrate embodiments of the invention by way of example,

FIG. 1 is a general perspective view of a circuit board storage cabinet with its doors in an open position, FIG. 2 is a perspective cut-away detail view of the circled area of FIG. 1, FIG. 3 is a sectional view of the two shelves in FIG. 1, taken along line 3—3 of FIG. 2, FIG. 4 is a similar view to FIG. 3 wherein an adjustment has been made to raise the height of the shelf, FIG. 5 is a front elevation view in the direction of arrow 5 of FIG. 2 partly cut-away to identify separate components, FIG. 6 is a local sectional view of a portion of a shelf and guide strip assembly according to the instant invention, taken along line 6—6 of FIG. 2, FIG. 7 is a local sectional view of another portion of the shelf and guide strip assembly according to the instant invention and taken along line 7—7 of FIG. 2.

Referring to FIG. 1, there is illustrated generally an anti-static cabinet for storing electronic circuit boards in accordance with the present invention. The cabinet is identified generally by numeral 8 and has a housing 10 provided with doors 12 for accessing the interior space 14 in the cabinet. The cabinet has a centre post 16 which provides stability and strength to the cabinet and also provides an attachment means for brackets (not shown in FIG. 1). Alternatively, two elongated brackets arranged back to back (not shown) may serve the purpose of a centre post. Two shelf assemblies in accordance with one embodiment of the instant invention are generally illustrated in FIG. 1. The shelf assemblies are supported by four elongated vertical brackets 18 (not all shown) which are fixed relative to the cabinet housing 10 to form the corners of a rectangle and which are capable of supporting several shelf assemblies. A second set of four elongated vertical brackets 18 with shelf assemblies (not shown) may be on the opposite side of centre post 16.

Since the purpose of cabinet 8 is to reduce as much as possible static electricity associated with circuit boards stored therein, the cabinet is grounded in a manner known to those skilled in the art. The housing 10 is constructed of metal and is grounded to and equipped with a ¼ inch grounding post at the rear of the cabinet (not shown). The housing 10 may optionally be coated with a paint-like product which ensures that the inside and outside of the cabinet is grounded to the touch in order to allow for the discharge of static electricity introduced by touching any part of the cabinet. The inside of each door 12 is equipped with metal strips 20 from top to bottom. The metal strips 20 may be copper or aluminium and are insulated by an appropriate insulating substance 22 from the doors, and the strips are connected to ground through 1 megohm resistors. The doors 12 are connected to ground by flexible grounding wire 24 or an equivalent arrangement such that the doors are grounded 100% in all positions opened or closed. All remaining component parts of the cabinet 8 are also fully grounded. Each door 12 is also equipped with grounded banana jacks and ground posts (not shown) to allow connection of grounding wrist straps (not shown) in a manner known to those skilled in the art. The wrist straps are worn by individuals using the cabinet such that any static electricity present in the individual will be dissipated prior to the individual depositing or retrieving electronic circuit boards stored in the cabinet. A pocket 26 on the inside of one door 12 may be used for storing anti-static bags, wrist straps, etc. The cabinet may also be equipped with a latch and lock mechanism on its doors (not shown in FIG. 1). Although FIG. 1 shows very generally two shelf assemblies 11, such a cabinet may normally be supplied with eight or more moveable shelves in addition to a fixed shelf on the bottom on each side of centre post 16.

Referring to FIG. 2, there is illustrated a perspective cut-away detail view of circled area 2 of FIG. 1 showing a shelf assembly 11 and the manner in which it interacts with four elongated vertical brackets 18.

The four elongated vertical brackets 18 are each fixed relative to the inside of cabinet 8. Although elongated vertical brackets 18 may assume a variety of configurations and still accommodate the purpose of the instant invention, the embodiment illustrated in FIG. 2 shows each elongated vertical bracket having a "C" shaped portion 28 which has therein a series of parallel evenly spaced horizontal slots 30. In a preferred embodiment the slots are ½ inch apart although their spacing may vary depending on the particular application in which they are employed. Each elongated vertical bracket 18 when fixed to the housing 10 by welding or other means, is positioned such that for each slot 30 on each bracket 18 there is a corresponding slot at exactly the same height on each of the other three vertical brackets 18 which may ultimately cooperate to support a shelf assembly 11 at a uniform height. In order to facilitate the quick location of slots of a corresponding height, the slots may be numbered as illustrated in FIG. 3.

A shelf assembly 11 is comprised of a shelf 30, two horizontal stationary brackets 32, two slidable element 34 and means for adjusting the height of shelf 30 relative to each horizontal stationary bracket 32.

As illustrated in FIG. 2, horizontal stationary bracket 32 extends between two respective elongated vertical brackets 18 and attaches thereto by bent tabs 36 which can be inserted into slots 30 of a corresponding height. The stationary bracket 32 also has a bent edge 38 which serves to better stabilize the horizontal stationary bracket 38 by corners 39 of bent edge 38 abutting against the elongated vertical bracket and/or the housing once tabs 36 are inserted into the slots of elongated vertical brackets 18. The horizontal stationary bracket 32 hangs from two horizontal slots 30 adjacent the faces of two vertical brackets 18. Horizontal stationary bracket 32 has two dowels or pins 40 which extend laterally from the surface 57 of horizontal stationary bracket 32 and at right angles thereto. Pins 40 may be metal or other suitable substance and may be welded to the surface of stationary bracket 32. In one embodiment made by the inventors, pins 40 were ¼ inch in diameter and ½ inch in length. Each pin 40 interacts with an elongated slot 42 which is vertical and located in vertical plate portion 44 which extends downward from the edge of shelf 30. The dimensions of elongated slot 42 must be such as to accommodate pin 40 in a manner providing for only vertical movement of the slot relative to the pin without permitting any horizontal movement of the slot 42 relative to pin 40. Such an arrangement permits shelf 30 to be raised up or down within the cabinet 8 while preventing movement of the shelf towards the back or front of the cabinet. Elongated slot 42 is open at its lower end 43 to permit removal of the shelf from its position of cooperation with the horizontal stationary bracket 18. Some grease may be applied to the edge of elongated slot 42 in order to facilitate lubrication and hence easy movement of pin 40 relative thereto.

Each shelf 30 has a front face 46, a rear face 48, sides 50, an upper surface 52 and a lower surface 54. The shelf surface may be rectangular or square in shape. The shelf may be metal and of box construction with the inside being hollow. The front face 46 of shelf 30 may accommodate means for labelling the shelf in connection with the identity of the circuit boards being stored thereon.

Horizontal stationary bracket 32 also has two weld screws 56 (best noted in FIG. 5) projecting laterally and perpendicularly from the surface 57 of said bracket. Slidable element 34 has two elongated slots 58 therein each with closed ends, which slots accommodate and cooperate with (are engaged by) screws 56. Slidable element 34 is mounted on screws 56 via slots 58 and thereafter washers 60 and nylon insert nuts 62 are placed on screws 56 so as to prevent slidable element 34 from moving laterally away from the surface 57 of horizontal stationary bracket 32. The aforesaid may be best illustrated in partly cut-away area C of FIG. 5. Grease may be applied between slidable element 34 and surface 57 of horizontal stationary bracket 32 in order to facilitate ease of movement of the path of each elongated slot 58 across screw 56 which is fixed.

Slidable element 34 has a couple of plates 64 (shown in FIG. 3) spot welded thereto. Each plate 64 has an inclining ramp or surface 66 which may be achieved by creating a bend in an edge of plate 64. Similarly vertical plate portion 44 of shelf 30 has a plate 68 having a declining ramp or surface 70 along its lower edge. Declining surface 70 may also be achieved by merely creating a bend of ¾ inches or so in plate 68. The angle of inclining surface 66 corresponds with the angle of declining surface 70 such that said surfaces may come into flush touching contact with each other as illustrated in FIG. 3.

Slidable element 34 and horizontal stationary bracket 32 each have a horizontal edge 72 and 74 as shown respectively in FIG. 2. Horizontal edges 72 and 74 provide strength and stability to the slidable element and stationary bracket respectively as will be apparent to those skilled in the art. Slidably element 34 may be moved horizontally within the parameters of elongated slot 58 relative to stationary bracket 32 by means of screw 76. Screw 76 may be made of nylon and has a knurled head 78. The threaded shaft 80 of screw 76 passes through holes (not separately shown) in vertical plates 82 and 84 of stationary bracket 32 and slidable element 34 respectively as may be seen in FIG. 2. As may be best noted by reference to FIG. 3, adjacent vertical plate 84 there is a weldnut 86 threaded to correspond to the threading on shaft 80 of nylon screw 76. Also present is a washer 88 and a tri-lock nut 90 which serve to fix screw 76 relative to vertical plate 82 of horizontal stationary bracket 32. Rotation of knurled head 78 of nylon screw 76 will result in slidable element 34 moving towards vertical plate 82 or away from said plate depending on the direction of rotation of said screw and the direction of threading on shaft 80 of screw 76.

As may be noted from FIGS. 3 and 4, rotating screw 76 in a direction causing movement of slidable element 34 towards vertical plate 82 (as shown by arrow 83) results in inclining surface 66 exerting pressure on declining surface 70, thereby elevating shelf 30 as illustrated by numeral 91 in FIG. 4. FIG. 2 also shows the shelf 30 partially raised as noted by the space at the upper end of slot 42 above the pin 40. The same is apparent from the position of inclining surface 66 relative to declining surface 70 in FIG. 2. It is preferred to have two inclining surfaces on each horizontal stationary bracket and two declining surfaces on the underside of the sides of each shelf in order to obtain a balanced, even and stable height adjustment of the shelf. The lengths of inclining surface 66 and declining surface 70 together with the angles thereof have been pre-determined in the preferred embodiment hereof to be sufficient for the desired height adjusting capacity. In the preferred embodiment, wherein slots 30 are ½ inch apart, the inclining and declining surfaces are approximately 2⅛ inches in length each and the angle of the inclining surface is about 25 degrees. By rotating screw 76 the shelf height may be adjusted at least ½ inch thereby being able to position the shelf at any height in the cabinet between any of the ½ inch slots 30. It will be readily apparent to those skilled in the art that slots 30 can be of varying distance apart from one another, as long as the distances are uniform, in which case the length of inclining and declining surfaces 70 and 66 as well as the angles of those surfaces may be adjusted to permit adjusting the height of the shelf to any point between slots 30. As may be noted in FIG. 3, the upper edge of guide strip 94 of surface 52 of shelf 30 is lined up with the height of slot No. 2 (not specifically shown) in vertical brackets 18. After adjusting the height, as noted in FIG. 4, the same upper edge has been raised a full ½ inch to the height of slot No. 3 on vertical brackets 18.

As may be noted from FIGS. 2 and 5, the component parts comprising the mechanism for adjusting the shelf height are found on both sides of shelf 30. Since both screws 76 and 76a shown in FIG. 2 have to be rotated in order to adjust the height of both sides of shelf 30. Adjustment screws 76 and 76a may be graduated by placing numerals on knurled head 78 or otherwise to facilitate adjustment of each side of the shelf to the same extent or degree. Alternatively, horizontal surface 74 may be graduated with numerals to permit an individual adjusting the height shelf to gauge the extent to which the shelf has been raised by the position of vertical plate 84 relative to said numerals. As long as the adjustment screw 76 and 76a are rotated the same amount, the height of shelf 30 will be uniformally adjusted without the need for any extraneously applied levelling means.

Referring to FIG. 2, a circuit board guide strip 94 is shown exploded to show fixing holes 104 and a location hole 106. In a preferred embodiment each guide strip cooperates with three fixing holes and one location hole.

Referring to FIGS. 2, 3 and 5, the electronic circuit boards are received in elongated horizontal slots 92 in guide strips 94 positioned on the upper and lower surfaces of shelf 30. As illustrated in FIG. 5, an electronic circuit board shown generally by No. 96 is supported in an up-right position between respective guide strips 94 on the surfaces 52 and 54 of two shelves which face each other. Each guide strip 94 has a mouth 98 to facilitate insertion of a circuit board into slot 92.

The guide strips are made out of a suitable plastic material known to the prior art which will dissipate static electricity present in a circuit board. In accordance with the instant invention, each guide strip is moulded to have on the underside thereof, at least one circular leg 100 as well as at least one rectangular leg 108. Leg 108 has a larger foot 102 at the end thereof.

Shelf 30 may be made of metal and may also be hollow as illustrated in the drawings. Upper surface 52 of shelf 30 has holes punched therethrough to receive and accommodate the legs of each guide strip. One set of holes 104 are "T" shaped and are fixing holes while the other set of holes 106 are circular. The leg 108 has a width smaller than the general width of the guide strip. The T shaped fixing hole 104 has dimensions which will accommodate, at the top of the T, rectangular foot 102 of guide strip 94. As may be appreciated from FIG. 2, having inserted rectangular foot 102 into T shaped hole 104, thereafter horizontal shifting guide strip 94 towards the front face 46 of shelf 30 will result in leg 108 of the guide strip snugly fitting and thereby becoming locked or trapped in the narrower area (bottom of the T) 105 of T shaped fixing hole 104. Circular leg 100 is positioned on the guide strip such that it can be press fitted into circular location hole 106 after the guide strip is locked or trapped into the T shaped holes. Because the width 107 of foot 102 is wider than the narrower width 105 of fixing hole 104 the guide strip cannot be removed and is securely attached to shelf surface 52. A fixing hole 104 and location hole 106 are illustrated in FIG. 3 in the cut away portion designated B.

The aforesaid arrangement facilitates quickly and easily inserting or removing guide strips from the upper and lower surfaces of the shelf. It may be noted from FIG. 2 that the T shaped fixing holes may be staggered which permits placing guide strips immediately adjacent one another, a configuration not otherwise possible in view of the width 107 of rectangular foot 102 as may be seen in FIG. 6.

The metal portions of the cabinet may optionally be coated with a paint which will dissipate static electricity introduced to the surface of such component parts. Although the disclosure herein refers to many parts being metal, those skilled in the art will recognize that it may be possible to utilize other appropriate substances which are not metal yet still serve the purpose of the anti-static cabinet described herein. In one embodiment, the outside dimensions of the antic-static storage cabinet in accordance with the present invention measures approximately 18 inches×36 inches×77 inches. The shelves 30 may have dimensions of 1 inches×16 inches×16 inches and capable of supporting 25Kg of weight in the centre thereof.

In accordance with the invention as described, the shelves are fully adjustable, first by relocating the horizontal stationary bracket to the desired slot thereby making a first height adjustment and second by moving the slidable element resulting in a fine tuning height adjustment, to allow for storage of any size circuit board. As long as slot 42 is only marginally wider than the diameter of pin 40 then the shelf adjustment mechanism will be self-locking at all heights and will support 25Kg of weight plus the shelf without moving. The shelf adjusting mechanism as described is extremely easy to operate and may be used to keep the shelf level to the horizon (assuming the cabinet itself has been properly levelled) without the use of any extraneous levelling instruments. Guide strips existing on any given shelf may be quickly removed and relocated in another position on the same shelf or another shelf very quickly without causing damage or wear and tear to the guide strip or the shelf. A guide strip when attached to a surface of a shelf in accordance with the invention is secured as being temporarily locked in place thereby being able to support a circuit board in its up-right position in a stable manner. To remove a guide strip from the shelf surface, circular leg 100 must be first removed from location hole 106. Thereafter the guide strip can be unlocked by sliding the guide strip towards the rear of the shelf thereby permitting rectangular foot 102 to be removed through T shaped hole 104.

Although the disclosure and drawings herein teach by way of example certain embodiments of the invention, it will be readily apparent to those skilled in the art that there are other embodiments which will satisfy the object and purpose of the invention and therefore will fall within the scope of the instant invention.

It should also be noted that the height adjusting mechanism may be employed wherever there are shelves used in association with elongated vertical brackets, and the use of the height adjusting mechanism described herein is by no means restricted to use in anti-static or any other type of cabinets.

We claim:

1. An anti-static cabinet for storing electronic circuit boards comprising,
    a housing provided with means to access the interior space therein,
    at least four elongated vertical brackets, two at the front and two at the rear, each fixed relative to said housing,
    at least two shelves each having front, side, rear, top and bottom faces and means suitable for supporting therebetween electronic circuit boards in an up-right position,
    at least two horizontal stationary brackets each one extending horizontally from an elongated vertical bracket at the front to an elongated vertical bracket at the rear and each with means for attaching to the elongated vertical brackets at various locations along the vertical length thereof,
    a slidable element communicating with each horizontal stationary bracket said slidable element having at least one inclining surface of a first angle,
    at least one of said at least two shelves having at least one declining surface projecting downward from said shelf adjacent each side thereof, said declining surface having a second angle corresponding to the first angle of the inclining surface of the slidable element such that said declining surface may come into flush contact with said inclining surface,
    each of said horizontal stationary brackets having means for supporting an opposite side of said at least one shelf in a manner permitting only vertical movement of each side of the shelf relative to said horizontal stationary bracket,
    adjustment means for horizontally moving each of said slidable elements so that pressure may be increased or decreased on said declining surface of said horizontal stationary bracket depending on the forward or backward direction of said horizontal movement, resulting in the respective side of said shelf moving vertically upwards or downwards relative to the said horizontal stationary bracket, whereby the perpendicular distance between said shelves may be adjusted, and wherein the slidable elements are elongated brackets each containing a horizontal elongated slot, and wherein the two horizontal stationary brackets each have means for engaging said horizontal slot of said slidable element such that the slidable element may move horizontally relative to said horizontal stationary bracket along the path of said horizontal sot, and wherein said means in said horizontal stationary bracket for supporting a sided of each shelf is a pin extending perpendicularly from each horizontal stationary bracket, said pin communicating with a vertical slot in a vertical plate portion located at each side of said shelf and extending downward therefrom.

2. The anti-static cabinet of claim 1 wherein each of said elongated vertical brackets contains parallel and evenly spaced horizontal slots, each of said elongated vertical brackets having a slot at the same height on each of said at least four elongated vertical brackets, and wherein said at least two horizontal stationary brackets each have at least two bent tabs thereon for insertion into slots of a corresponding height on two adjacent elongated vertical brackets for secure attachment of the horizontal stationary brackets to the elongated vertical brackets.

3. The anti-static cabinet of claim 2 wherein,
    said means on each horizontal stationary bracket for engaging said horizontal slot of said slidable element is a second pin with means thereon for preventing removal of the horizontal slot from the second pin after said horizontal slot is mounted thereon,
    said adjustment means for horizontally moving said slidable element is a threaded screw fixed relative to a vertical plate attached to the horizontal stationary bracket and rotatable through a threaded hole in a vertical plate attached to said slidable element so as to be self-locking upon any adjustment.

4. The anti-static cabinet of claim 3 wherein,
    each horizontal stationary bracket has two pins projecting laterally therefrom,
    each vertical plate portion at the sides of each shelf has two vertical slots therein and two declining surfaces thereon each said vertical slot being open at the lower end thereof to permit access therein by said pins,
    each horizontal stationary bracket also has two second pins thereon each projecting laterally and perpendicularly towards the shelf and wherein each second pin is a bolt and means for preventing removal of the horizontal slot is a nut,
    each slidable element has two horizontal elongated slots therein and two inclining surfaces thereon,
    said pins, second pins, vertical slots, horizontal slots on the slidable element and said inclining and declining surfaces are located relative to each other to provide balanced and stable height adjustment of said shelf.

5. The anti-static cabinet of claim 4 wherein:
    said threaded screw or said horizontal stationary bracket has graduations thereon for measuring quantitatively the horizontal movement of the slidable element.

6. The anti-static cabinet of claim 5 wherein,
    wherein said elongated vertical brackets have a C shaped portion,
    and wherein each horizontal stationary bracket has a bent edge a portion of which abuts against an elongated vertical bracket and/or the housing of the cabinet.

7. A guide strip for communicating with a surface of a shelf for use to support an electronic circuit board in an up-right position, said guide strip having an underside and a top side with at least a first and a second leg on the under side thereof said first leg having a generally rectangular foot foot and being of a generally inverted T-shape, said second leg being short and generally circular, said guide strip having an elongated slot closed at one end on the top side thereof for receiving an edge of a circuit board, said shelf having a front face and the surface of said shelf having a first hole being generally T-shaped and of a shape suitable to trap the foot of said first leg when inserted therein and horizontally shifted, the surface of said shelf having a second hole into which said second leg can be press fitted, said second hole being generally circular, said first and second holes being located on the shelf surface in an alignment perpendicular to the front face of the shelf, wherein said guide strip may be quickly and securely attached to the surface of the shelf by first trapping in the first hole the foot of the first leg by horizontally shifting in a first direction only said guide strip relative to the surface of the shelf and thereafter by press fitting the second leg into the second hole, and whereby said guide strip may be removed from the surface of the shelf by first releasing the second leg from the second hole and thereafter by horizontally shifting in a direction opposite to said first direction the guide strip to release the foot of the first leg.

8. The guide strip of claim 7 including on the underside thereof at least two additional first legs and the surface of said shelf having at least two additional first holes.

9. An adjustable bracket and shelf assembly comprising, at least four elongated vertical brackets each capable of being fixed relative to each other to form the corners of a rectangle, at least one shelf having front, side, rear, top and bottom faces, at least two horizontal stationary brackets each one extending between two elongated vertical brackets adjacent the sides of said at least one shelf and each with means for simultaneously attaching to the two elongated vertical brackets at various locations along the lengths thereof, a slidable element communicating with each horizontal stationary bracket said slidable element being an elongated bracket and having at least one inclining surface of a first angle, said shelf having at least one declining surface projecting downward there from adjacent to each side thereof said declining surface having a second angle corresponding to the first angle of the inclining surface of the slidable element such that said declining surface may come into flush contact with said inclining surface, each of said horizontal stationary brackets having means for supporting an opposite side of said shelf in a manner permitting only vertical movement of each side of the shelf relative to said horizontal stationary bracket, an adjustment means for horizontally moving each of said slidable elements so that pressure may be increased or decreased on said declining surface of said horizontal stationary bracket depending on the forward or backward direction of said horizontal movement, resulting in the respective side of said shelf moving vertically upwards or downwards relative to the said horizontal stationary bracket.

10. The adjustable bracket and shelf assembly of claim 9 wherein, each of said elongated vertical brackets contains parallel and evenly spaced horizontal slots each of said elongated vertical brackets having a slot at the same height on each of said at least four elongated vertical brackets and wherein the two horizontal stationary brackets each have at least two bent tabs thereon for insertion into the slots of a corresponding height onto two adjacent elongated vertical brackets for secure attachment of the horizontal stationary brackets to the elongated vertical brackets.

11. The adjustable bracket and shelf assembly of claim 10 wherein, the slidable elements each contain a horizontal elongated slot and wherein the two horizontal stationary brackets each have means for engaging said horizontal slot of said slidable element such that the slidable element may move horizontally relative to said horizontal stationary bracket along the path of said horizontal slot, and wherein said means in said horizontal stationary bracket for supporting a side of the shelf is a pin extending perpendicularly from each horizontal stationary bracket, said pin communicating with a vertical slot in a vertical plate portion located at each side of the shelf and extending downward therefrom.

12. The adjustable bracket and shelf assembly of claim 11 wherein, said means on each horizontal stationary bracket for engaging said horizontal slot of said slidable element is a second pin with means thereon for preventing removal of the horizontal slot from the second pin after the horizontal slot is mounted thereon, said adjustment means for horizontally moving said slidable element is a threaded screw fixed relative to a vertical plate attached to the horizontal stationary bracket and rotatable through a threaded hole in a vertical plate attached to said slidable element so as to be self-locking upon any adjustment.

13. The adjustable bracket and shelf assembly of claim 12 wherein, each horizontal stationary bracket has two pins projecting laterally therefrom, each vertical plate portion at each side of the said shelf has two vertical slots therein and two declining surfaces thereon each said vertical slot being open at the lower end thereof to permit access therein by said pins, each horizontal stationary bracket also has two second pins thereon each projecting laterally and perpendicularly towards the shelf and wherein each second pin is a bolt and wherein means for preventing removal of the horizontal slot is a nut, each slidable element has two horizontal elongated slots and two inclining surfaces, said pins, second pins, vertical slots, horizontal slots on the slidable element and said inclining and declining surfaces located on the various component parts to provide balanced and stable height adjustment of said shelf.

14. The adjustable bracket and shelf assembly of claim 13 wherein, said threaded screw or said horizontal stationary bracket has graduations thereon for measuring quantitatively the horizontal movement of the slidable element, wherein said elongated vertical brackets have a C-shaped portion, and wherein each said horizontal stationary bracket has a bent edge for abutting against an elongated vertical bracket and/or other surface.

* * * * *

UNITED STATES PATENT AND TRADEMARK OFFICE
CERTIFICATE OF CORRECTION

PATENT NO. : 5,168,431
DATED : December 1, 1992
INVENTOR(S) : John L. Moulton and Frank G. Camilleri It is certified that error appears in the above-identified patent and that said Letters Patent is hereby corrected as shown below:

Claim 1, column 9, line 68, cancel "sot" and insert --slot--.

Claim 1 column 10, line 2, cancel "side" and insert --sided--.

Signed and Sealed this

Twenty-first Day of December, 1993

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO. : 5,168,431
DATED : December 1, 1992
INVENTOR(S) : John L. Moulton and Frank G. Camilleri It is certified that error appears in the above-identified patent and that said Letters Patent is hereby corrected as shown below:

<u>IN THE CLAIMS</u>

Claim 1, column 9, line 68, cancel "sot" and insert --slot--.

Claim 1, column 10, line 2, cancel "sided" and insert --side--.

This Certificate supersedes Certificate of Correction issued Dec. 21, 1993.

Signed and Sealed this

Twelfth Day of April, 1994

Attest:

BRUCE LEHMAN

*Commissioner of Patents and Trademarks*

*Attesting Officer*